United States Patent
Besling et al.

(10) Patent No.: US 7,986,184 B2
(45) Date of Patent: Jul. 26, 2011

(54) RADIO FREQUENCY AMPLIFIER WITH EFFECTIVE DECOUPLING

(75) Inventors: Willem Frederick Adrianus Besling, Eindhoven (NL); Theodorus Wilhelmus Bakker, Cuÿh (NL); Yann Lamy, Crolles (FR); Jinesh Kochupurackal, Taman Jurong (SG); Fred Roozeboom, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/641,817

(22) Filed: Dec. 18, 2009

(65) Prior Publication Data

US 2011/0148529 A1    Jun. 23, 2011

(51) Int. Cl.
*H03F 1/00*    (2006.01)

(52) U.S. Cl. .......................... 330/67; 330/307
(58) Field of Classification Search .............. 330/67, 330/307, 277, 292
See application file for complete search history.

(56) References Cited

U.S. PATENT DOCUMENTS

| | | | |
|---|---|---|---|
| 5,352,991 A * | 10/1994 | Lipschultz et al. | 330/289 |
| 7,084,708 B2 * | 8/2006 | Sugiura et al. | 330/302 |
| 7,898,338 B2 * | 3/2011 | Blednov | 330/295 |

* cited by examiner

*Primary Examiner* — Henry K Choe

(57) ABSTRACT

A variety of circuits, methods and devices are implemented for radiofrequency amplifiers. According to one such implementation, a radiofrequency amplifier circuit is implemented in a SMD package. The circuit amplifies a radiofrequency signal having a base-band portion and a plurality of carrier signals frequency-spaced larger than the base-band bandwidth. The circuit includes a radiofrequency transistor connected to a circuit output having a parasitic output capacitance. The source-drain terminal is electrically connected to the circuit output. An internal shunt inductor provides compensation for the parasitic output capacitance. A high-density capacitor is connected between the internal shunt inductor and a circuit ground. The high-density capacitor has a terminal with a surface area can be at least ten times that of a corresponding planar surface.

13 Claims, 11 Drawing Sheets

RADIO FREQUENCY AMPLIFIER WITH EFFECTIVE DECOUPLING

FIELD OF THE INVENTION

The present invention relates generally to radio frequency circuits, and more specifically, to decoupling for radio frequency amplifiers.

BACKGROUND

Telecommunication includes the transmission of signals over a distance for the purpose of communication. To accommodate increasing demands on data bandwidth, some telecommunications protocols involve conversions between a baseband frequency and a higher frequency/radio-frequency (RF). For instance, a high-frequency carrier signal is modulated by a baseband signal for transmission. For receipt, the modulated carrier signal is demodulated back to a baseband signal. Thus, the baseband signal is shifted to much higher (RF) frequencies during transmission.

Base stations used in RF transmissions include power amplifiers that operate at RF signal speeds. These amplifiers operate at the high RF frequencies, and preferably maintain the fidelity of the signal during amplification. Telecommunications are subject to limitations based upon the inherent limitations of the available frequency spectrum. Accordingly, emerging wireless communication protocols implement new techniques for increasing the data-throughput of the communications. Unfortunately, these new techniques can push the limits of current technology. The base band (video) bandwidth has been increasing to accommodate ever increasing throughput demands. Moreover, wireless communication protocols use multiple carrier frequencies upon which data is carried. Thus, base stations will operate upon multiple carrier frequencies simultaneously. Issues arise in which aspects of the RF transmissions can cause unwanted baseband-level interference.

SUMMARY

The present invention is exemplified in a number of implementations and applications, some of which are summarized below.

Consistent with an example embodiment of the present invention, a radiofrequency amplifier circuit that is constrained to a small package size is implemented with a radiofrequency transistor having a gate terminal and a drain terminal. A circuit output, having parasitic output capacitance, is connected by a bond wire to the source-drain terminal. An internal shunt inductance circuit provides compensation for the parasitic output capacitance. The internal shunt inductance circuit also provides an effective resistance of less than about 0.5 Ohms at all frequencies below about 80 MHz. This internal shunt inductance circuit is implemented using a high-density capacitor having a first terminal connected to circuit ground and an internal shunt inductance that is connected between the source-drain terminal and a second terminal of the high-density capacitor.

Consistent with another embodiment of the present invention, a method is implemented for creating a radiofrequency amplifier circuit having a high-density capacitor and a radiofrequency transistor. The high-density capacitor is formed by forming a first plate of the capacitor by patterning and etching a highly-doped (e.g., n++ or p++) Si or GaN substrate to form a set of pores of about 0.8 μm to 1.5 μm in diameter, about 20 μm to 35 deep and having a pitch of about 2 μm to 3 μm. An oxide, nitride, oxide layer on a front side of the Si substrate by oxidizing the etched Si substrate, depositing a silicon nitride on the oxidized Si substrate, and producing a silicon oxide film on the deposited silicon nitride; a second plate of the capacitor is formed by depositing polysilicon on the silicon oxide film and depositing an electrode on the deposited polysilicon. The electrode is connected to the radiofrequency transistor using an electrical connection having an inductance, the electrical connection and high-density capacitor having sufficient inductance and capacitance to provide compensation for parasitic output capacitance of the radiofrequency transistor.

According to one embodiment of the present invention, a radiofrequency amplifier circuit is implemented in a surface mount device (SMD) package. The circuit amplifies a radiofrequency signal having a base-band portion and a plurality of carrier signals frequency-spaced larger than the base-band bandwidth. The circuit includes a radiofrequency transistor connected to a circuit output having a parasitic output capacitance. The source-drain terminal is electrically connected to the circuit output. An internal shunt inductor provides compensation for the parasitic output capacitance. A high-density capacitor is connected between the internal shunt inductor and a circuit ground. The high-density capacitor has a terminal with a (three-dimensional) surface area that is at least ten times that of a corresponding planar surface.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1A:
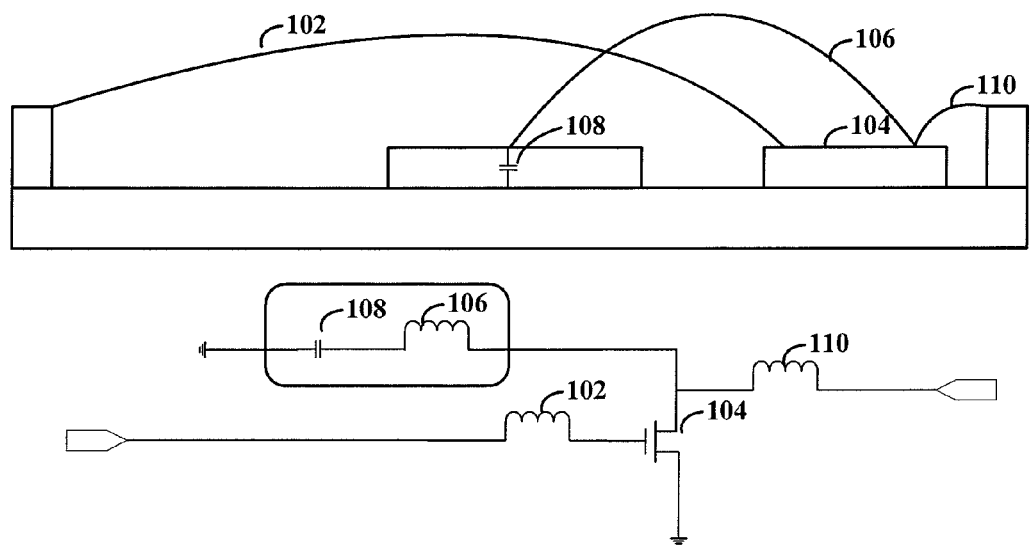
FIG. 1A depicts an RF power transistor that includes a low-frequency filter circuit, consistent with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

DETAILED DESCRIPTION

The present invention is believed to be applicable to a variety of different types of processes, devices and arrangements for use with radio frequency (RF) amplifiers. While the present invention is not necessarily so limited, various aspects of the invention may be appreciated through a discussion of examples using this context.

Embodiments of the present invention relate to a RF amplifier having a parasitic capacitance that causes undesirable signal characteristics. For instance, parasitic output capacitance can cause the effective gain of the amplifier to vary as a function of the frequency of the signal being amplified. Aspects of the present invention relate to a compensation circuit that compensates for the parasitic capacitance. In certain implementations the compensation circuit also compensates for other undesirable signal components.

RF amplifiers amplify high frequency carrier(s) (e.g., up to several GHz) modulated by digital signals. Particular implementations involve the use of multiple carrier frequencies, such as with orthogonal frequency division multiplexing (OFDM), for transmitting the data. Accordingly, amplifiers can be used to amplify signals that contain multiple carrier frequencies.

If two (or more) signals with different frequencies are amplified, there can be undesirable results. For instance, when two signals are amplified the difference between the signals can cause the peak amplitude of the amplified signal to vary according to a frequency that equals the first frequency minus the second frequency. Significant changes in peak amplitudes can result in nonlinear responsiveness of the amplifier due to thermal differences caused by significant differences in power consumption (e.g., a high peak-to-average ratio (PAR)). This is sometimes referred to as a "memory effect." Aspects of the present invention are particularly useful for mitigating such unwanted effects. In particular, an RF power amplifier device is implemented that provides decoupling circuits for low frequency power-draw variations. Specific implementations allow for the implementation of such a device within a single surface mount device (SMD) package.

Radiofrequency (RF) transistors, e.g., high frequency power transistors, are widely used to provide the amplification. These devices typically suffer from parasitic output capacitance $C_{out}$, which limits their operational bandwidth, their power efficiency and their power gain. Aspects of the present invention relate to the use of a compensation element, a compensation inductance or Internal Shunt Inductance, sometimes referred to as inshin In one implementation the compensation element typically is attached between the RF device's output and the ground through a decoupling capacitor. In this way, a parallel resonance is provided with the parasitic output capacitance $C_{out}$ at the operational frequency. This provides an increased output impedance of the device having a low imaginary part, which helps for better matching of the device output to the load in the required frequency band.

For further details on optimization of the RF power device using an output compensation circuit, reference can be made to PCT publication No. WO 02/058149, Power Transistor With Internally Combined Low-Pass And Band-Pass Matching Stages, which is fully incorporated herein and which describes an output compensation stage comprising two capacitors that obtain a double internal post-matching of the transistor. Such compensation circuits can benefit from mutual inductive coupling between the output compensation stage and from a reduced bond wire between the output electrode of the transistor and the output lead, providing improved output compensation.

The length of the bond wires results in an equivalent parasitic inductance value. This value is limited by physical constraints, as the bond wires must have sufficient length to connect the output of the transistor die to the output lead. This parasitic inductance has a negative impact on several operational aspects of the device, such as e.g., the operational bandwidth, the power efficiency, the reliability, the obtainable gain and maximum power, etc. Accordingly, an output compensation circuit can be implemented to improve RF performance, such as improved power gain and power efficiency at RF frequencies. The compensation circuit is specially configured so as to control/decrease the length of the bond wires, thereby resulting in a better matching circuit which leads to better power efficiencies. For further details on such a circuit, reference can be made to PCT publication No. WO/2006/097893, Method And System For Output Matching Of Rf Transistors, which is fully incorporated herein by reference.

In base station power amplifiers where more than one carrier is amplified, the carriers can be relatively far apart (e.g., 50 MHz or more). Aspects of the present invention relate to compensating for the resulting low frequency modulation on the drain supply voltage. As base band (video) bandwidth increases, the video decoupling should keep pace so as to accommodate ever increasing throughput demands. In particular, high-density capacitors are used to short the low frequencies (low frequency decoupling). This, however, is frustrated by the competing desire for large transistors and small package sizes. Generally speaking, as the transistor increases in power, the need for higher capacitance also increases. This is due to the desire to provide effective low-impedance for video decoupling. For instance, some applications require an effective low-frequency impedance of: Zlf=0.4 Ohm/100 W Pout. Aspects of the present invention are particularly useful for providing such effective low-frequency impedance, even for 200+ W transistors. Moreover, various implementations provide this capacitance decoupling with a small (e.g., SMD) package device. This can be particularly useful for controlling the inductance, such as inductance due to long bond wires that connect to external capacitors.

A particular embodiment is directed toward a lateral diffused metal-oxide semiconductor transistor (LDMOST) device within an SMD package. Aspects of the present invention realize that parallel plate capacitors do not provide sufficient capacitance-density for such devices. For instance, package constraints can limit the capacitance to around 100 pF; however, a 100 pF capacitance can call parallel resonances that have undesired impedance peaks in the low frequency region. Accordingly, a high-density capacitor is provided in the LDMOS transistor circuit.

In certain implementations, the LDMOS power transistors include one or more active dies, capacitors and bond wires packaged together. The bond wires and capacitors provide matching circuits to improve the impedance level of the transistor(s). A capacitor of at least 20 nF is provided for low-frequency filtering. The capacitor has a physical thickness of less than 200 μm and a capacitor area of about 5 mm$^2$ so as to fit within the LDMOS (SMD) package.

A specific implementation of the present invention is directed toward an RF transistor (e.g., a lateral diffused metal-oxide semiconductor transistor (LDMOST)) device with a high-density capacitor constrained to about 5 mm$^2$, and/or to a physical thickness of less than about 200 μm. In one implementation, the high-density capacitor provides a capacitance of 15 nF (3 nF/mm$^2$). In another implementation, the high-density capacitor provides a capacitance of 20 nF (e.g., about 4 nF/mm$^2$). In another implementation, the high-density capacitor provides a capacitance of 25 nF (e.g., about 5 nF/mm$^2$). The invention, however, is necessarily limited thereto.

Embodiments of the present invention are directed towards an RF transistor with reliability and lifetime requirements for operating characteristics (e.g., voltage and temperatures) associated with RF amplifier applications. For instance, one characteristic is the operating DC supply voltage. For a particular LDMOS transistor, the operating DC supply voltage can be about 30V on the drain. Another operating characteristic is the operating temperature of the decoupling capacitor, which is estimated to be around 100-125° C., based partially upon the operating temperature of the transistor, which can reach 150° C. Another characteristic is the failure rate over a typical lifetime. For instance, given a lifetime expectancy of 10 years, less than 0.1% of the devices should fail with a 50% confidence interval. This can be calculated at the desired operating characteristics (e.g., 30V at 125° C.).

A particular aspect of the embodiment of the present invention relates to the use of three-dimensional (3D) surface area electrodes. The (3D) surface area component of the electrodes is particularly useful for increasing the surface area of the electrode within constraints on lateral area, and thereby for increasing the capacitive density. A specific implementation includes pores etched into the substrate that forms the electrode. Other implementations are also possible and are discussed in more detail herein.

Embodiments of the present invention relate to specific designs for the 3D surface area. These designs include pitch size, pore size and different pad landing used to achieve a large (e.g., 15 nF-25 nF) capacitance. For instance, a pore size of 0.8 um, a pore pitch of 1.8 um and a pore depth of 22 um are used to achieve a capacitance density of >5 nF/mm$^2$.

Aspects of the present invention recognize that planar capacitors provide 200 nm oxide film thickness which is sufficient to meet the 30V/125° C./10 year spec; however, it has been recognized that capacitance density requirement is not met in 3D structures upon using 200 nm thick thermal oxide. In order to achieve a sufficiently large capacitance density the film thickness can be decreased or the dielectric constant should be enlarged. If, however, the dielectric film thickness is chosen too thin, the desired breakdown voltage will be too low. Accordingly, aspects of the present invention utilize dielectric stacks that incorporate dielectric materials with higher k-value than silicon oxide (i.e., SiN). For instance, oxide-nitride-oxide (ONO) stacks of 215 nm thickness show a breakdown voltage of around 120V-130V. For a constant operating voltage of 30V, a 120V-130V breakdown voltage can provide sufficient safety margin for various life time requirements.

Moreover the physical position of the compensation circuit can be particularly important, e.g., for obtaining low inductance values. For instance, reductions in the bond length (and therefore inductance) can result in a broader effective bandwidth for the RF device. A smaller bond wire length can also result in less power dissipation and hence in higher efficiencies. As such, an embodiment of the present invention is directed to obtaining short lengths for the bond wires that are connected to the inshin-capacitors, thereby providing a low induction at low frequencies.

Physical distances, for example laterally to the extra leads or the distance of the inshin capacitor to the decoupling capacitors on the test circuit, play a much larger role.

Turning now to the figures, FIG. 1A depicts an RF power transistor that includes a low-frequency filter circuit, consistent with an embodiment of the present invention. Bond wire 102 connects an external package input to an internal component/die. FIG. 1A depicts an implementation where bond wire 102 connects to the base of RF transistor 104. Bond wire 110 connects the drain of transistor 104 to an external package output 120. Bond wire 106 connects the drain of transistor 104 to a high-density compensating capacitor 108. The bond wires have an inductive component shown by the equivalent circuit of FIG. 1A.

The device characteristics include undesirable susceptibility to low frequency components that can arise, e.g., due to multiple carrier amplification. For instance, device and circuit characteristics can create undesirable frequency components. An inshin compensation component 106 is provided to compensate for these frequency components. Notwithstanding, parasitic capacitance on the drain of the transistor can be particularly problematic for certain applications in that low frequency variations can be seen on the voltage supply providing power to the circuit. Accordingly, the LC circuit 106-108 is designed to compensate for such low-frequency variations by providing a capacitor 108 of sufficient size. In some implementations, capacitor 108 is designed to provide a capacitance of greater than 15 nF within an area of about 5 mm$^2$ and 200 μm in thickness. The dimensions (e.g., size and thickness) are not necessarily limited thereto. In specific implementations, capacitor 108 has a capacitance of between 15 nF and 25 nF, but the capacitive values are not necessarily limited thereto.

Figure 1B:
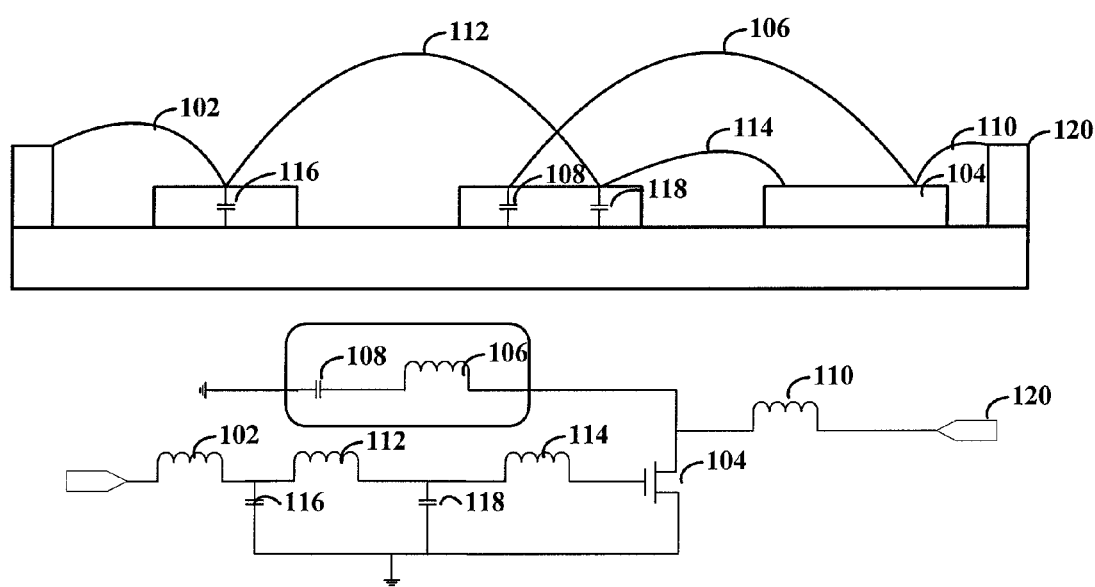
FIG. 1B depicts an RF power transistor that includes an output compensation circuit that provides low-frequency filtering, consistent with an embodiment of the present invention.

FIG. 1B depicts an RF power transistor that includes an output compensation circuit that provides low-frequency filtering, consistent with an embodiment of the present invention. Consistent with FIG. 1A, the RF power transistor includes bond wire 102, which connects an external package input to an internal component/die. In this instance, bond wire 102 connects to an output compensating capacitor 116. Bond wire 112 connects to another compensating capacitor 118, and therefrom, bond wire 114 connects to the base of RF transistor 104. Bond wire 110 connects the drain of transistor 104 to an external package output 120. Bond wire 106 connects the drain of transistor 104 to a high-density compensating capacitor 108.

Another implementation incorporates one or more of the individual dies into a single die. In such an instance, the connections between components can be implemented on the die and without bond wires. For instance, the high-density capacitor can be implemented on the same die as the RF power transistor. This can be particularly useful for increasing the available area for the capacitor and thereby allowing for higher capacitive values.

Figure 2:
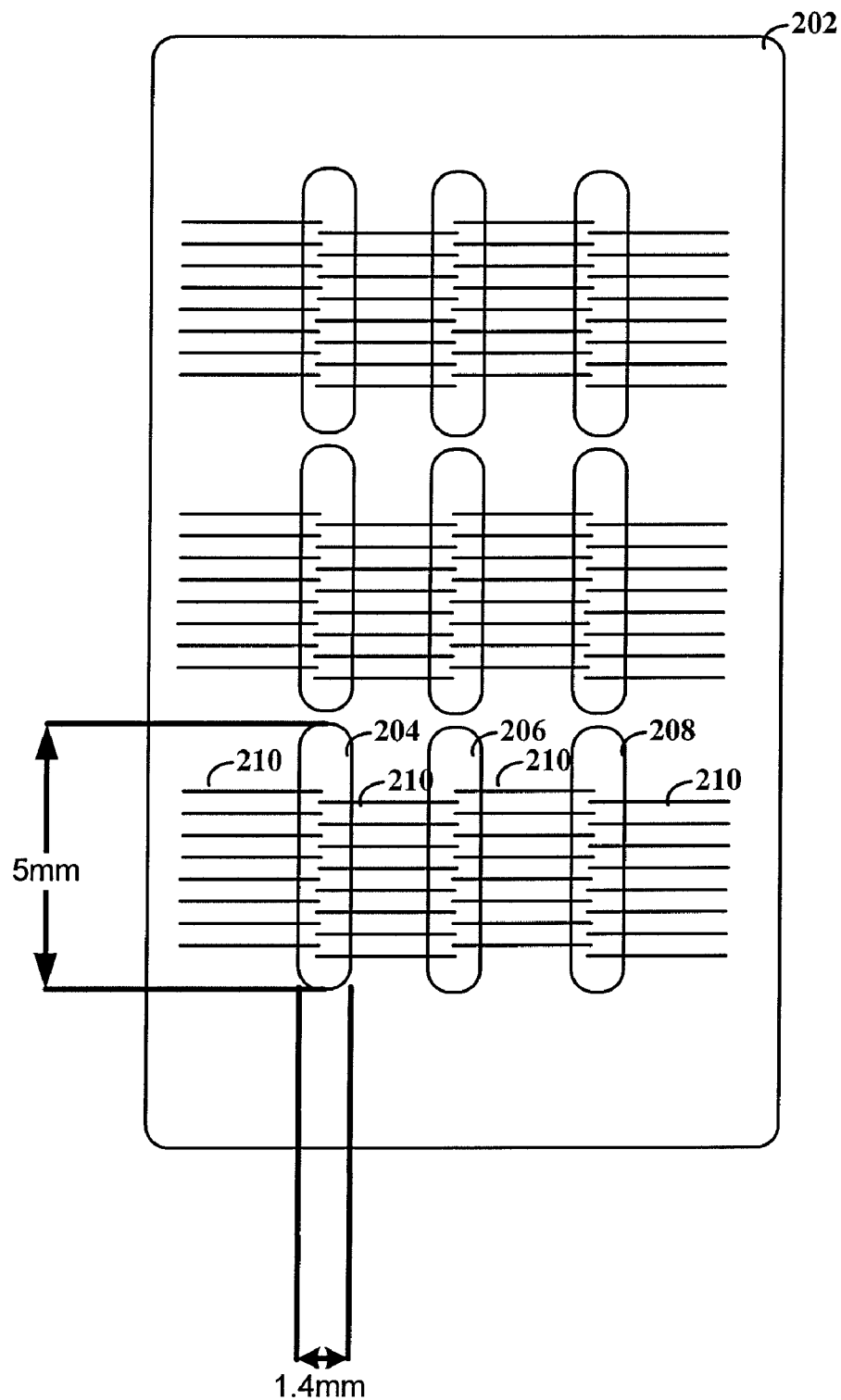
FIG. 2 depicts a top-down view of an open RF transistor package, consistent with an embodiment of the present invention.

FIG. 2 depicts a top-down view of an open RF transistor package, consistent with an embodiment of the present invention. In a particular implementation, the RF transistor package is implemented as a SMD package. Suitable SMD packages include, but are not necessarily limited to, small-outline transistor (SOT) packages, such as SOT502 and SOT539.

Dice 204, 206, 208 are connected by bond wires 210. Each individual die provides a function of a RF power transistor, a high-density capacitor, a compensation circuit or other circuit aspects that may be desired. As shown in FIG. 2, the package size poses limitations on the area available for the high-density capacitor. In the particular example shown, the available area is limited to about 5 mm×1.4 mm or 7 mm².

Figure 3A:
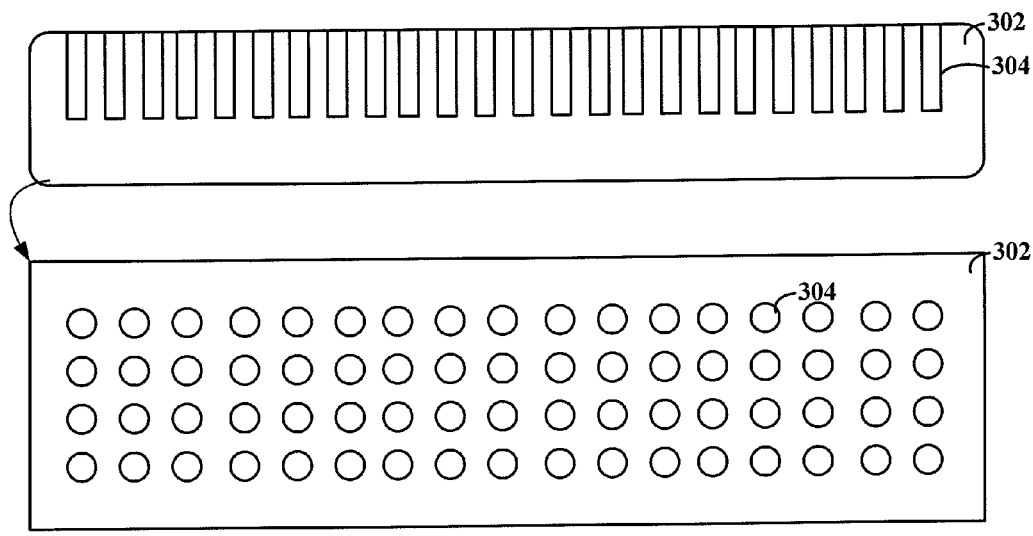
FIG. 3A shows a substrate having three-dimensional (3D) pores, consistent with an embodiment of the present invention.

FIGS. 3A-3L depict devices corresponding to various processing steps for producing a high-density capacitor consistent with an embodiment of the present invention. FIG. 3A shows a substrate 302 having 3D pores 304. Although not limiting in the specific manner of formation, an example implementation of substrate 302 is a highly doped (n++ or p++) Si or GaN wafer. The 3D pores greatly increase the surface area of substrate 302. For example, a surface area of about 10-25 times that of a planar surface can be realized in connection with the following, non-limiting, parameters. Patterning and etching of vias/pores can be implemented with a pore mask (e.g., 40 min etch time, ~20 µm-40 µm deep: etch rate is 0.922 um/min, assuming no etch-loading effect). A specific example generates pores of between 0.8-1.5 um in diameter and having a pitch of between 2 µm and 3 µm. Another example generates pores of between 0.5 µm to 1.5 µm in diameter, about 10 µm to 35 µm deep and having a pitch of about 1 µm to 3 µm. Other embodiments relate to repeating 3D structures having similar dimensions. For instance, a sequence of pillars can be implemented that are between 0.5 µm to 1.5 µm in diameter, about 10 µm to 35 µm deep/tall and having a pitch of about 1 µm to 3 µm.

Other embodiments provide additional methods for providing increased surface area. For instance, rather than etching pores and leaving most of the substrate intact, pillars could be constructed by etching most of the substrate and leaving the pillars. Other example structures include trenches or honeycomb structures that are etched in the silicon surface. Combinations of different structures can also be implemented. In each instance, the surface area can be increased ten times or more, thereby significantly increasing the capacitive potential of the electrode.

Figure 3B:
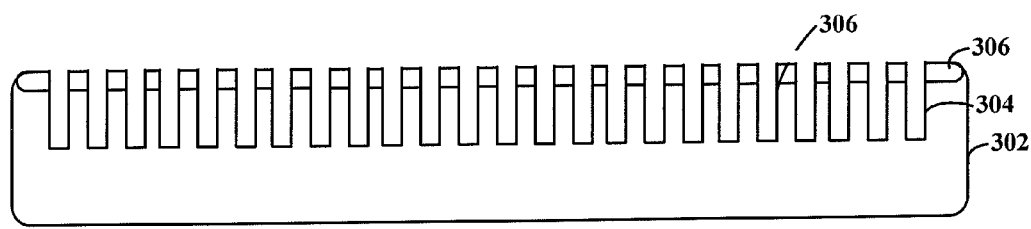
FIG. 3B depicts the formation of at least a portion of a dielectric layer on the substrate, consistent with an embodiment of the present invention.

FIG. 3B depicts the formation of at least a portion of a dielectric layer on the substrate, consistent with an embodiment of the present invention. Insulation layer 306 is produced to provide at least a portion of the dielectric layer of the end capacitor. In a particular implementation, insulation layer 306 is generated using thermal oxidation. The thickness of the oxidation layer can be set according to the desired design constraints. In a particular, non-limiting example, the targeted depth for the oxidation layer is around 100 nm. This oxidation layer can also be generated within the trenches (or as part of other three dimensional structures).

Figure 3C:
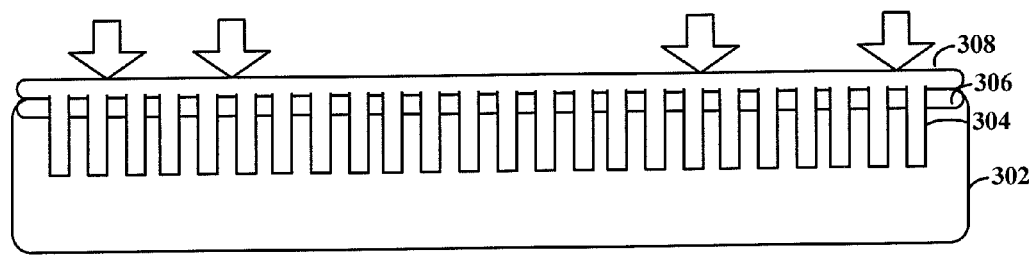
FIG. 3C depicts the formation of at least a portion of a dielectric layer on the substrate, consistent with an embodiment of the present invention.

FIG. 3C depicts the formation of at least a portion of a dielectric layer on the substrate, consistent with an embodiment of the present invention. In a particular implementation, layer 308 is generated to form part of an ONO stack. For instance, layer 308 is produced using LPCVD SiN deposition. The thickness of the nitride layer can be set according to the desired design constraints. In a particular, non-limiting example, the targeted thickness for the nitride layer is around 100 nm. The nitride layer can also be deposited within the pores (or onto other three-dimensional structures).

Although not specifically shown by FIG. 3, dielectrics other than an ONO stack are possible. For instance, oxide, nitride (ON) or oxynitride (NO) stacks are possible. The characteristics of the dielectric can be determined based upon the operating parameters of the device (e.g., the break-down voltage and temperature, and desired capacitance). Together these factors determine the dielectric materials and designs that are suitable for the particular application.

Figure 3D:
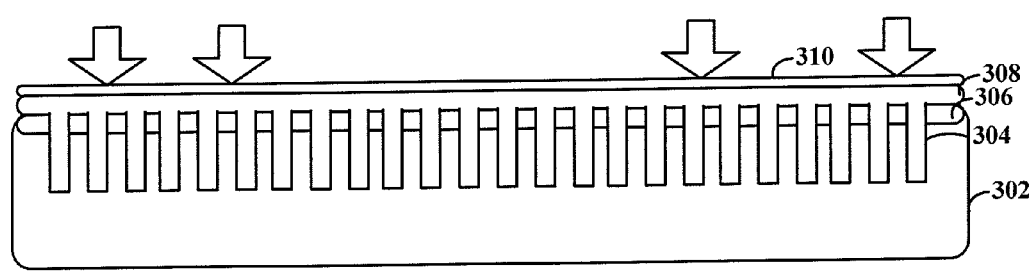
FIG. 3D depicts the formation of at least a portion of a dielectric layer on the substrate, consistent with an embodiment of the present invention.

FIG. 3D depicts the formation of at least a portion of a dielectric layer on the substrate, consistent with an embodiment of the present invention. In a particular implementation, layer 310 is generated to form part of an ONO stack. For instance, layer 310 is produced using LPCVD TEOS deposition. The thickness of layer 310 can be set according to the desired design constraints. In a particular, non-limiting example, the targeted thickness is around 15 nm.

Figure 3E:
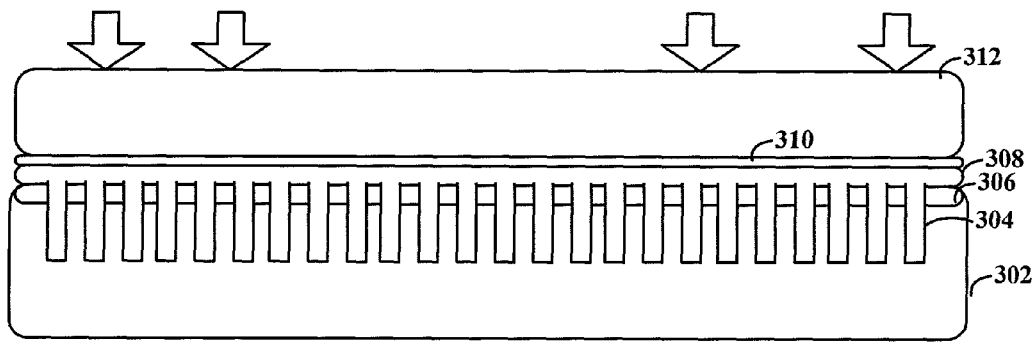
FIG. 3E depicts the formation of a conductive layer, consistent with an embodiment of the present invention.

FIG. 3E depicts the formation of a conductive layer, consistent with an embodiment of the present invention. In a specific implementation, layer 312 is a poly-silicon layer that can be generated by deposition. The desired resistivity, thickness and other parameters are adjustable. In one example implementation, layer 312 is implemented as an n-type phosphorous-doped poly-silicon layer. This allows for a resistivity of around 1050 µΩcm. In a specific, non-limiting, example, the thickness is around 735 nm. In certain implementations, this thickness is chosen to be sufficient to completely fill the pores (or other three-dimensional structures).

Figure 3F:
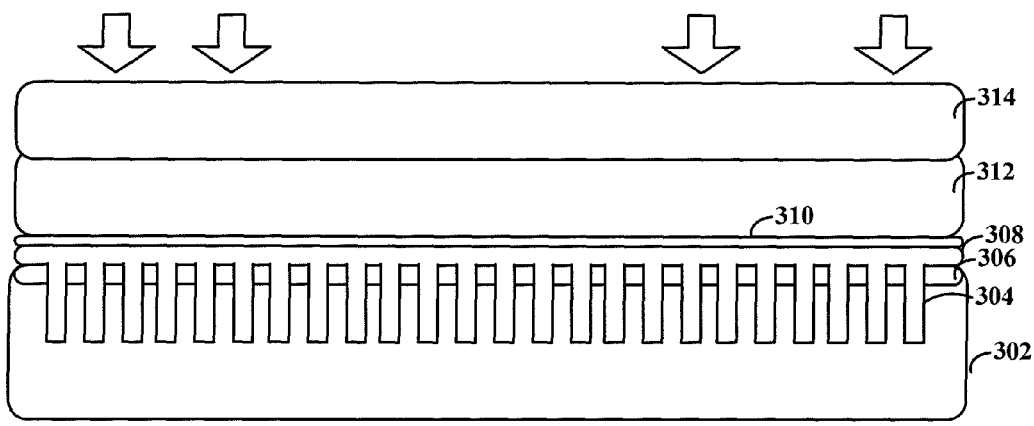
FIG. 3F depicts the formation of a conductive layer or top electrode layer, consistent with an embodiment of the present invention.

FIG. 3F depicts the formation of a conductive layer or top electrode layer, consistent with an embodiment of the present invention. The electrode layer 314 can be used as a contact layer for connection to external circuits, e.g., using bond wires or other electrical connections. Various conductive materials can be used, including metals such as aluminum, copper, silver, gold and combinations thereof. In a particular implementation, the electrode layer 314 is formed from AlCuSi (0.04%) deposition. In a specific, non-limiting example, the thickness of the electrode layer is around 1.5 µm.

Figure 3G:
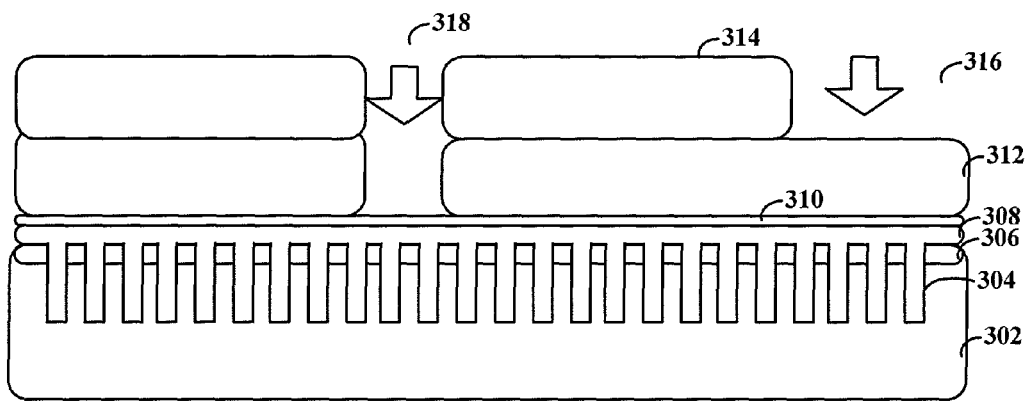
FIG. 3G depicts patterning of both of the conductive layers, consistent with an embodiment of the present invention.

FIG. 3G depicts patterning of both of the conductive layers, consistent with an embodiment of the present invention. Area 316 shows patterning of the electrode layer 314, without patterning of the conductive layer 312. Area 318 shows patterning of both conductive layers 312, 314. Such patterning can be implemented to form a variety of different patterns and structures as desired.

Figure 3H:
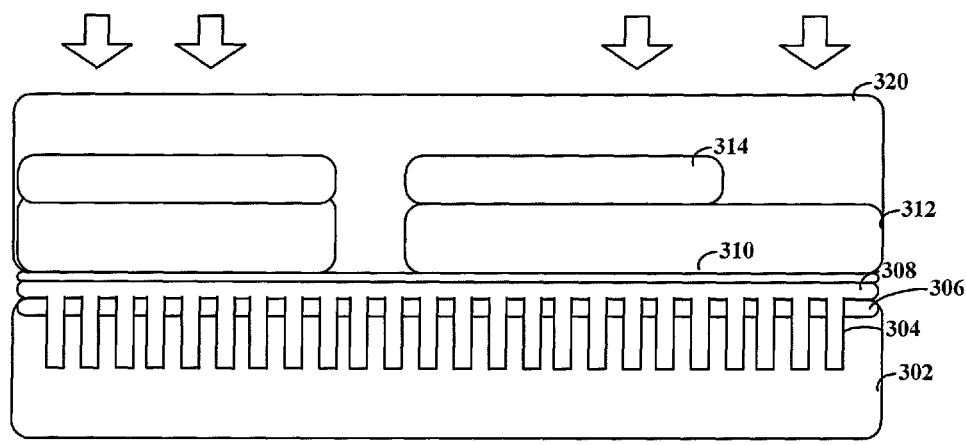
FIG. 3H depicts encapsulation of a portion of the device, consistent with an embodiment of the present invention.

FIG. 3H depicts encapsulation of a portion of the device, consistent with an embodiment of the present invention. If desired, a protective layer 320 can be formed over the device. This encapsulation can be implemented, for example, using LPCVD TEOS or PECVD SiN deposition.

Figure 3I:
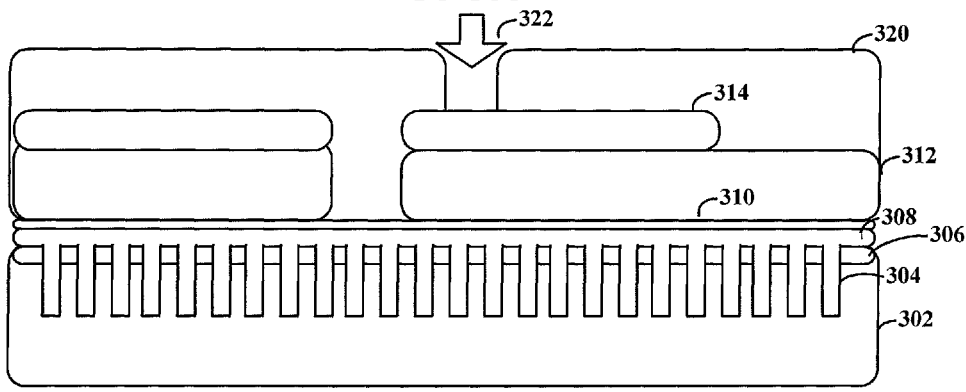
FIG. 3I depicts removal of at least a portion of the protective layer, consistent with an embodiment of the present invention.

FIG. 3I depicts removal of at least a portion of the protective layer, consistent with an embodiment of the present invention. Portions 322 of the protective layer 320 can be selectively removed. These openings can be used to provide contacts for the capacitive device.

Figure 3J:
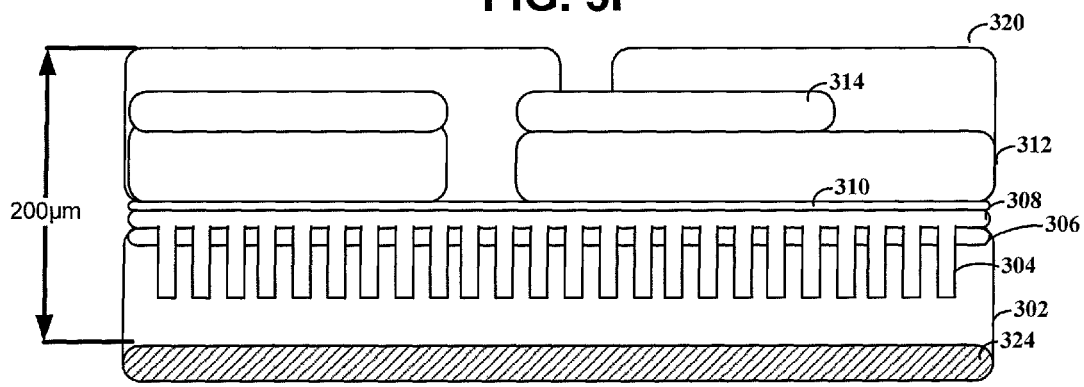
FIG. 3J depicts thinning of the device, consistent with an embodiment of the present invention.
Figure 3K:
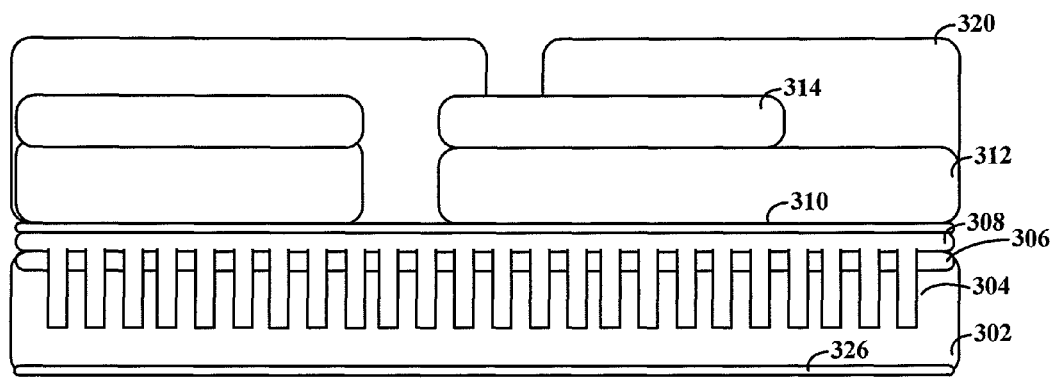
FIG. 3K depicts formation of a backside contact layer, consistent with an embodiment of the present invention.

FIG. 3J depicts thinning of the device, consistent with an embodiment of the present invention. A portion 324 of the device can be removed from the substrate 302 to a desired overall thickness for the device. For instance, the device can be thinned to 200 µm. Such wafer thinning of the device can be implemented to meet design constraints and can provide the added benefit of providing reduced series resistance.

FIG. 3H depicts formation of a backside contact layer, consistent with an embodiment of the present invention. A contact layer 326 can be formed to be used as a contact layer for connection to external circuits, e.g., using bond wires or other electrical connections. For instance, contact layer 236 can be formed by metallization of the substrate 302 (e.g., using eutectic gold). In certain implementations, it can be advantageous to define a small line or a number of spots in the capacitor mask without any pores. Landing pads can then be placed over these pore-free areas. This can be particularly useful for providing mechanical strength to the land pad areas.

Figure 3L:
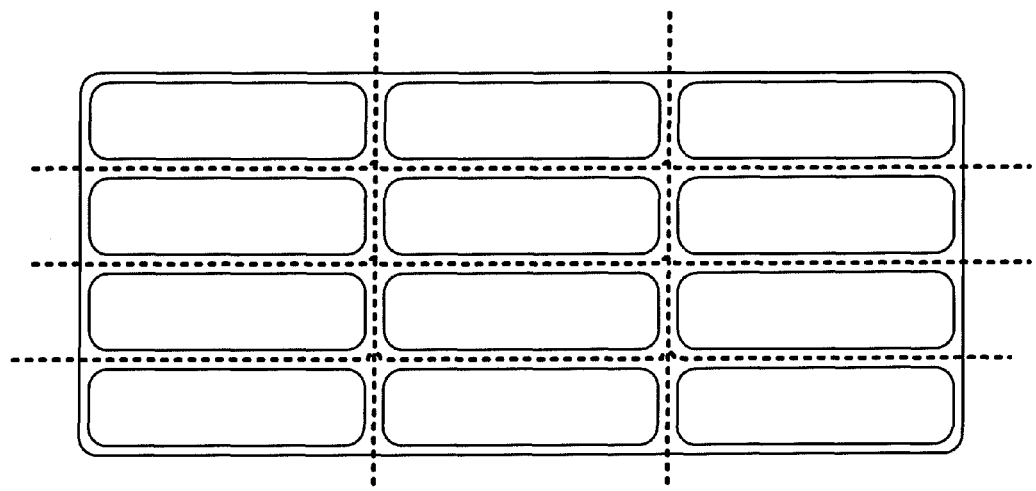
FIG. 3L depicts dicing of a wafer of multiple capacitive devices, consistent with an embodiment of the present invention.
Figure 4A:
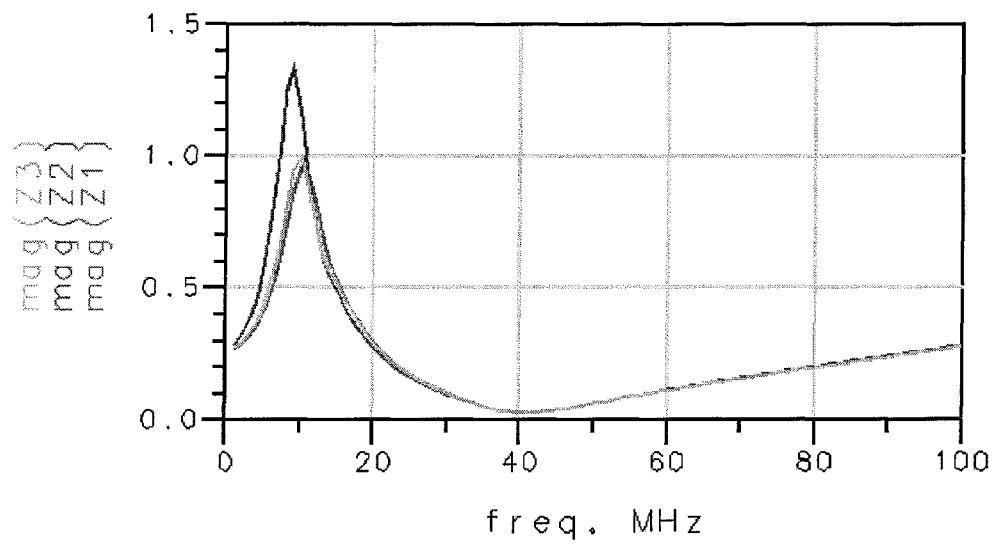
FIG. 4A depicts experimental modeling results of an RF amplifier circuit relative to the impedance on the drain of a 100 pF inshin capacitor, consistent with embodiments of the present invention.
Figure 4B:
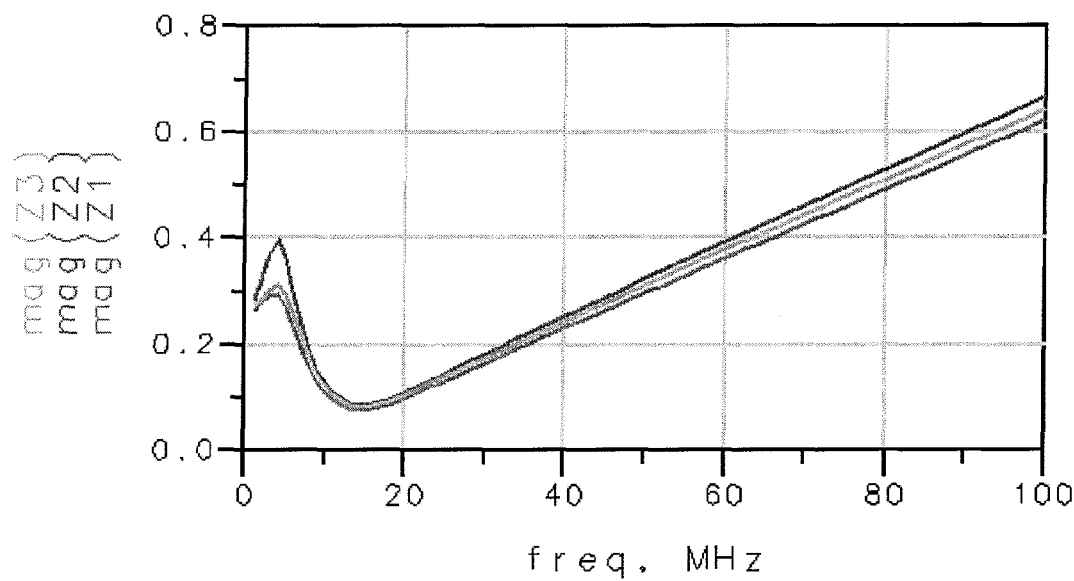
FIG. 4B depicts experimental modeling results of an RF amplifier circuit relative to the impedance of the drain with a large (15 nF) inshin capacitor, consistent with embodiments of the present invention.

FIG. 3L depicts dicing of a wafer of multiple capacitive devices, consistent with an embodiment of the present invention. The dicing can be set to the desired final size, which can be selected to be compatible with the desired RF power transistor and package. For instance, the dimensions can be about 5.6 mm×1.4 mm for a SMD package. The resulting high-density capacitors can then be used in an RF power transistor, such as a LDMOS power amplifier device FIGS. 4A and 4B depict experimental modeling results of an RF amplifier circuit, consistent with embodiments of the present invention. The RF amplifier circuit that was modeled included an LDMOS power transistor having an inshin compensation circuit that includes a high-density capacitor. The modeled device includes three LDMOS-active dice. The effective impedance of each die was modeled as Z1, Z2 and Z3, and was relatively consistent across all the dice. However, the impedance on the central die (Z2) was higher than the two outer die (Z1, Z3). This is due to distribution effects that result in a slightly higher impedance on the central die. The total impedance of the device was reduced through the use of additional leads within the package.

FIG. 4A shows the impedance on the drain of a low value, 100 pF, inshin capacitor. FIG. 4B shows the impedance of the drain with a large (15 nF) inshin capacitor. A relatively-simple lumped-element model was used to simulate the electronic circuit and is believed to accurately describe the behavior/general trends of the circuit. These two graphs show that parallel resonances caused unwanted impedance peaks in the low frequency region. The effective impedance of a circuit using a 100 pF cap rises above 0.4 Ohm effective impedance at 15 MHz. FIGS. 4A and 4B show that the addition of a larger capacitor decreases the impedance peak, but can also result in higher overall impedance over the frequency spectrum.

Accordingly, aspects of the present invention recognize that a larger capacitance (e.g., +15 nF) does not necessarily yield the desired impedance reduction at moderate frequencies. Particular embodiments use impedance matching in the form of controlling the number and/or length of bond wires used within the device.

Figure 5A:
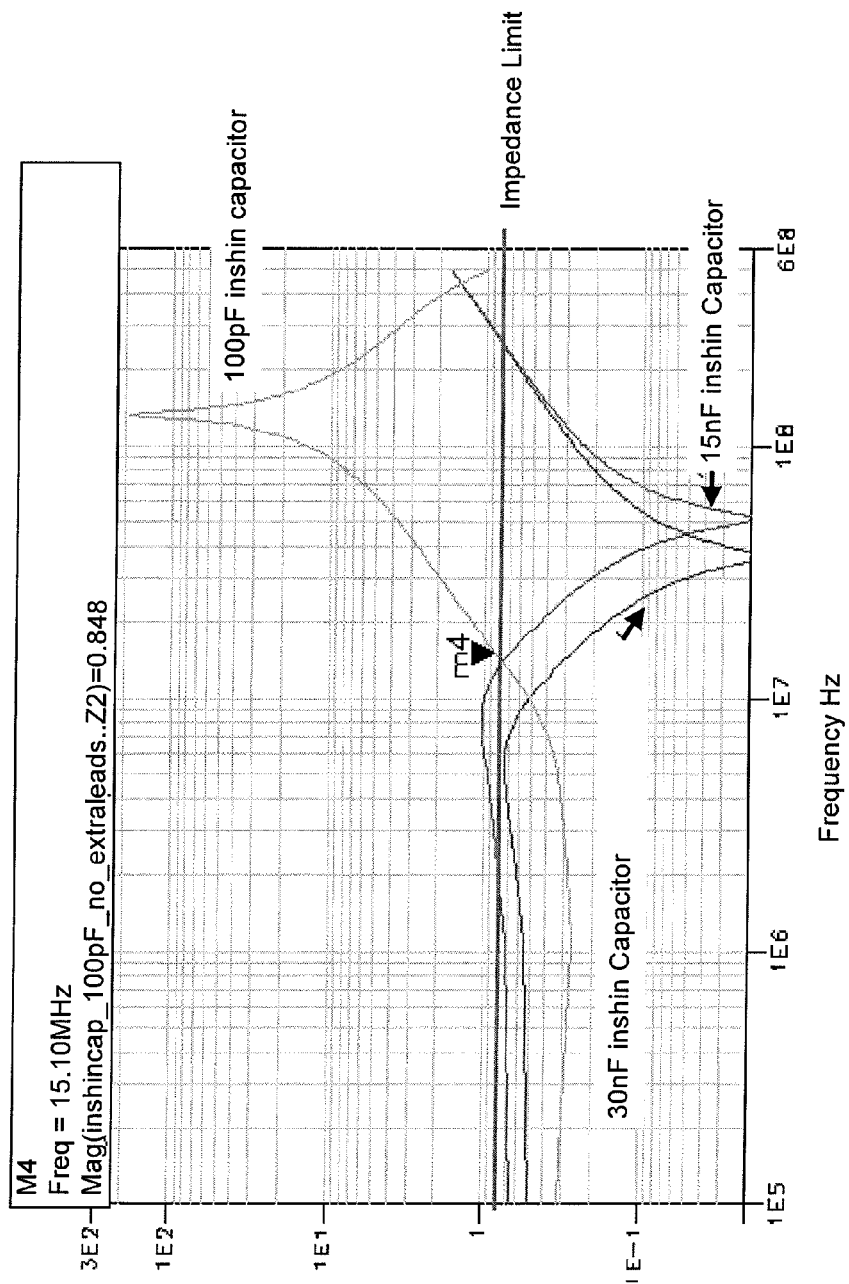
FIG. 5A shows modeled impedance as seen on the internal drain of the transistor, consistent with an embodiment of the present invention.

FIG. 5A shows modeled impedance as seen on the internal drain of the transistor, consistent with an embodiment of the present invention. FIG. 5A shows that the use of a significant larger inshin capacitor shifts the resonance to lower frequencies and that the capacitor provides sufficiently low impedance in the shifted resonance. For instance, proper circuit configuration in combination with inshin capacitors of a value larger than 15 nF can provide a video/baseband bandwidth that exceeds 200 MHz.

Modeling of a 100 pF capacitor yielded a high peak in impedance at about 150 MHz. This impedance exceeds the 0.8 Ohm limit at about 15 MHz, and rapidly increases for values greater than 15 MHz. This is believed to be due to the parallel resonance of the inshin capacitor with the inductance of the bias lines, which have capacitors to short the low frequencies. Modeling shows that the use of a slightly bigger capacitor (200 pF or 300 pF) causes the parallel resonance to shift down, resulting in a worsened video bandwidth performance. A smaller inshin capacitor was shown to result in poor RF performance.

Figure 5B:
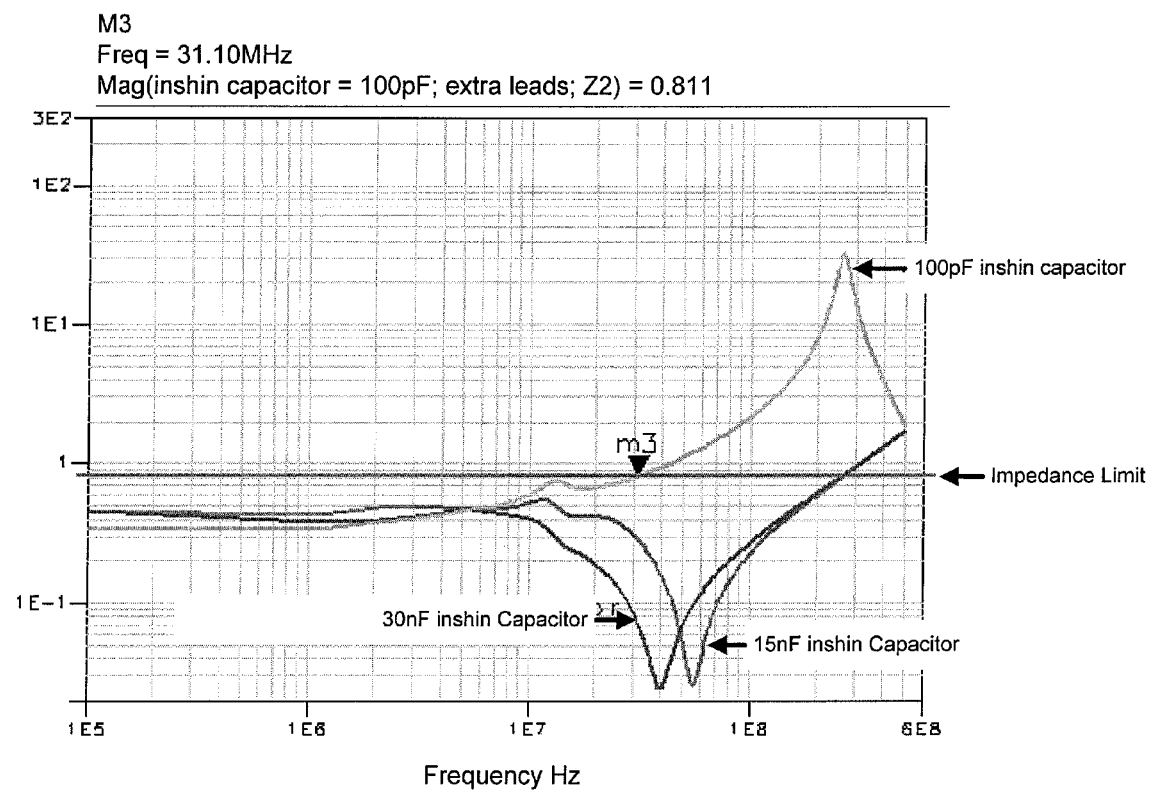
FIG. 5B shows modeling results after circuit optimization (e.g., reduction of impedance by adding leads to the package), consistent with an embodiment of the present invention.

FIG. 5B shows modeling results after circuit optimization (e.g., reduction of impedance by adding leads to the package), consistent with an embodiment of the present invention. FIG. 5B shows the modeled impedance as seen on the internal drain of the transistor. The optimization can be implemented by, for instance, reducing the impedance by adding leads/bond wires to the package. The extra bond wires also allow the upper limit for the small decoupling capacitors to move from 15 MHz to 30 MHz. Moreover, the decoupling can be improved from 30 MHz to 300 MHz by increasing the capacitance of the "inshin" capacitor to 15 nF or greater.

The simulation of FIGS. 5A and 5B was implemented using a 2.5D simulator (momentum of Agilent). Bond wires and the high density caps were modeled with the 2.5D simulator to take into account distribution effects. The resulting plot shows the impedance on the internal drain of the LDMOS transistor, and the simulation includes the measured s-parameters for the capacitors and other portions of the RF circuit, such as the supply lines.

Figure 6A:
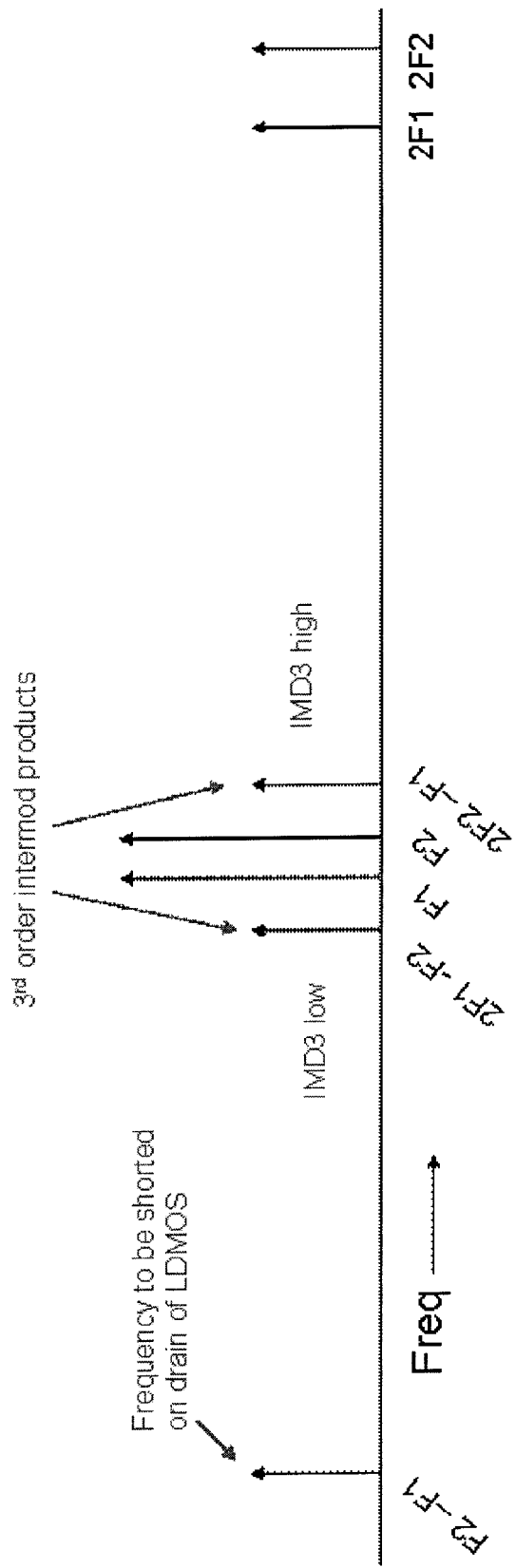
FIG. 6A shows 2 tone-spectrum of a non-linear amplifier, consistent with an embodiment of the present invention.

FIG. 6A shows 2 tone-spectrum of a non-linear amplifier. The difference frequency (F2-F1) represents a frequency that, if not effectively shorted by the capacitor, can show up on the drain of the LDMOS transistor. The level of 3rd order intermodulation product (IMD3) for particular tone spacing is important to determine the video bandwidth performance.

Figure 6B:
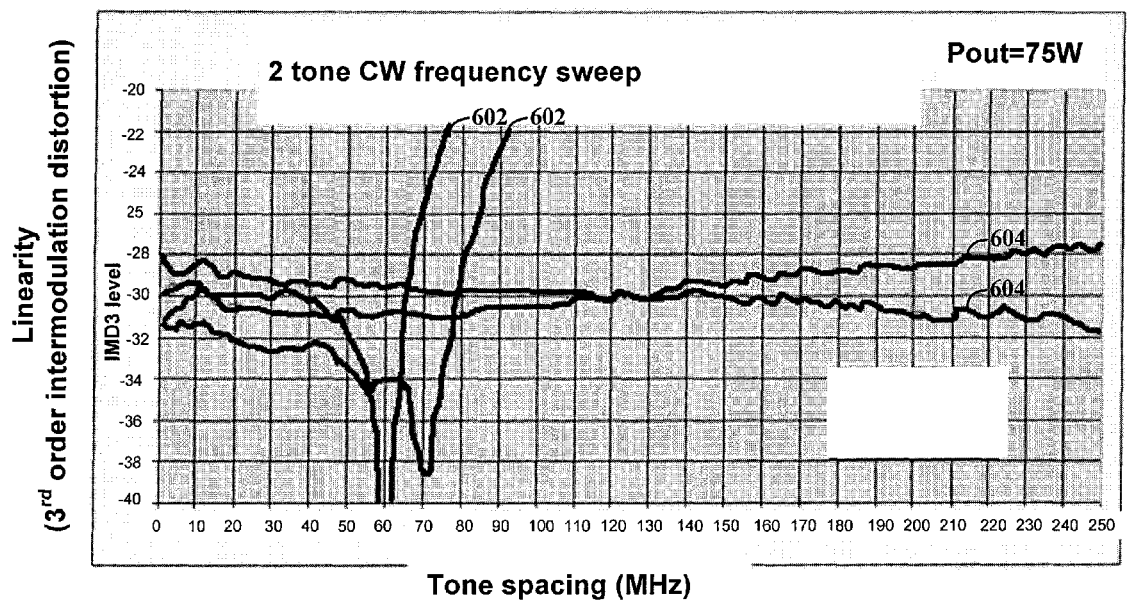
FIG. 6B shows linearity/distortion as a function of tone spacing and with regard to the capacitance of the inshin capacitors, consistent with an embodiment of the present invention.

FIG. 6B shows linearity/distortion as a function of tone spacing and with regard to the capacitance of the inshin capacitors, consistent with an embodiment of the present invention. Linearity of $3^{rd}$ order intermodulation distortion (IMD3) is expressed in dB relative to the carrier level. FIG. 6B shows the results of sweeping the spacing of 2 carriers from 1 to 250 MHz. The power was kept at 75 W average, and the IMD3 upper and lower channels were plotted. Lines 602 describe the IMD behavior of the amplifier with low-capacitance inshin capacitors. Lines 604 describe the behavior of the same amplifier with high-density inshin capacitors.

If the IMD rises above a certain level, then the usefulness of the amplifier can be severely frustrated. For instance, the digital pre-correction routine may cease to be effective for canceling out the resulting non-linearities. Lines 602 show spectral asymmetry across the varying tone spacing. Lines 604 show a relatively small difference between the low and high tones, which shows good spectral symmetry. Generally speaking, standard decoupling would stop at 60-70 MHz for devices corresponding to lines 602.

In FIG. 6B, the gate decoupling was completely removed, which results in a very flat spectrum in combination with a damping resistor of 0.5 Ohm in series with the drain decoupling capacitors.

The capacitance density and breakdown voltages for different oxide/nitride dielectric stacks were modeled to arrive at a stack of 100 nm thermal oxide, 100 nm of LPCVD silicon nitride and 15 nm of LPCVD oxide. Other embodiments relate to thinning the ONO layer down to 70/70/15 and reducing the etch depth to 10 um in combination with the use of pillars as the three-dimensional structure to provide a capacitance density of 3 nF/mm2.

While the present invention has been described above and in the claims that follow, those skilled in the art will recognize that many changes may be made thereto without departing from the spirit and scope of the present invention.

What is claimed is:

1. A radiofrequency amplifier circuit constrained to a surface-mount-device package size and designed for amplifying a radiofrequency signal that includes base-band portion and a plurality of carrier signals, the carrier signals having frequency spacing that is greater than a bandwidth of a base-band portion of the radiofrequency signal, the circuit comprising:
   a radiofrequency transistor having a gate terminal and a drain terminal;
   a circuit output having a parasitic output capacitance;
   an electrical connection between the source-drain terminal and the circuit output;
   an internal shunt inductor providing compensation for the parasitic output capacitance; and
   a high-density capacitor providing capacitance sufficient to provide low effective impedance at frequencies near the frequency spacing and connected between the internal shunt inductor and a circuit ground, the high-density capacitor including a terminal with an outline containing three-dimensional structures, the terminal having a surface area about at least ten times of a planar surface of the same outline.

2. The circuit of claim 1, wherein the high-density capacitor provides at least one of a capacitance of at least 15 nF and a capacitive density of at least 3 nF/mm$^2$.

3. The circuit of claim 1, wherein the radiofrequency transistor and the high-density capacitor are located on a common substrate.

4. A radiofrequency amplifier circuit constrained to a package size, the circuit comprising:
   a radiofrequency transistor having a gate terminal and a drain terminal;
   a circuit output having parasitic output capacitance;
   a bond wire connected between the source-drain terminal and the circuit output; and
   an internal shunt inductance circuit providing compensation for the parasitic output capacitance and providing effective impedance of less than about 0.5 Ohms at all frequencies below about 80 MHz, the internal shunt inductance circuit including
      a high-density capacitor having a first terminal connected to circuit ground, and
      an internal shunt inductance that is connected between the source-drain terminal and a second terminal of the high-density capacitor.

5. The radio frequency circuit of claim 4, wherein the internal shunt inductance is a bond wire.

6. The radio frequency circuit of claim 4, wherein the high-density capacitor has at least one of a capacitance of at least 15 nF and a capacitive density of at least 3 nF/mm$^2$.

7. The radio frequency circuit of claim 4, wherein the high-density capacitor includes a three dimensional surface area electrode.

8. The radio frequency circuit of claim 4, wherein the high-density capacitor includes a three dimensional surface area silicon-based electrode having pores of about 0.5 μm to 1.5 μm in diameter, about 10 μm to 35 μm deep and having a pitch of about 1 μm to 10 μm.

9. The radio frequency circuit of claim 7, wherein the three dimensional surface area electrode includes a structure that includes one or more of pores etched in a surface, pillars extending from the silicon surface, trenches, and honeycomb structures.

10. The radio frequency circuit of claim 4, wherein the high-density capacitor includes a dielectric stack that is one of an oxide/nitride/oxide (ONO) stack, a oxide/nitride stack (ON), and a oxynitride (NO) stack.

11. The radio frequency circuit of claim 10, wherein the dielectric stack is an ONO stack that includes at least about 70 nm thermal oxide, about 70 nm of silicon nitride and about 15 nm of oxide.

12. The radio frequency circuit of claim 4, wherein the high-density capacitor has a thickness of less than about 200 μm and a cross-sectional area of less than about 7 mm$^2$.

13. The radio frequency circuit of claim 4, wherein the transistor is a laterally diffused metal oxide semiconductor transistor.

* * * * *